(12) United States Patent
Dumitru et al.

(10) Patent No.: US 9,136,490 B2
(45) Date of Patent: Sep. 15, 2015

(54) SOLAR CELL HAVING HYBRID HETEROJUNCTION STRUCTURE AND RELATED SYSTEM AND METHOD

(75) Inventors: Viorel-Georgel Dumitru, Prahova (RO); Mihai N Mihaila, Bucharest (RO); Bogdan-Catalin Serban, Bucharest (RO)

(73) Assignee: Honeywell International Inc., Morristown, NJ (US)

( * ) Notice: Subject to any disclaimer, the term of this patent is extended or adjusted under 35 U.S.C. 154(b) by 2047 days.

(21) Appl. No.: 12/250,033

(22) Filed: Oct. 13, 2008

(65) Prior Publication Data

US 2010/0051092 A1 Mar. 4, 2010

(30) Foreign Application Priority Data

Aug. 27, 2008 (EP) .................. EP08163118

(51) Int. Cl.
*H01L 31/00* (2006.01)
*B05D 5/12* (2006.01)
(Continued)

(52) U.S. Cl.
CPC ............ *H01L 51/426* (2013.01); *B82Y 30/00* (2013.01); *H01L 51/0036* (2013.01); *H01L 51/0038* (2013.01); *H01L 51/4226* (2013.01); *H01L 51/4233* (2013.01); *Y02E 10/549* (2013.01)

(58) Field of Classification Search
CPC ............ H01L 51/426; H01L 51/0036; H01L 51/0038; H01L 51/4226; H01L 51/4223; B82Y 30/00; Y02E 10/549
USPC .................... 136/255, 263; 427/74
See application file for complete search history.

(56) References Cited

U.S. PATENT DOCUMENTS 7,230,269 B2    6/2007  Rand et al.
7,612,367 B2 *  11/2009 Brabec et al. ................ 257/40
(Continued)

FOREIGN PATENT DOCUMENTS

WO    WO 2004/017234 A2    2/2004
WO    WO 2004/017345 A1    2/2004
(Continued)

OTHER PUBLICATIONS

Jan Gilot, et al., "Double and triple junction polymer solar cells processed from solution", Applied Physics Letters 90, 143512 (2007), 3 pages.
(Continued)

*Primary Examiner* — Tamir Ayad

(57) ABSTRACT

A solar cell includes multiple organic materials (including at least one donor material and at least one acceptor material) and multiple inorganic materials. The organic and inorganic materials collectively form multiple hybrid heterojunction structures. Each hybrid heterojunction structure includes at least two organic materials and at least one inorganic material. A first of the inorganic materials could include nanowires and/or nanotubes, and a second of the inorganic materials could include nanoparticles and/or quantum dots. At least some of the nanoparticles or quantum dots could have different sizes, where the different sizes are associated with different absorption bandgaps. Excitons photo-generated in at least one of the organic materials may dissociate into holes and electrons. Also, electrons and holes photo-generated in at least one of the inorganic material may separate. Further, one or more of the inorganic materials may transport at least some of the electrons towards one of multiple electrodes.

20 Claims, 3 Drawing Sheets

(51) Int. Cl.
  *H01L 51/42* (2006.01)
  *B82Y 30/00* (2011.01)
  *H01L 51/00* (2006.01)

(56) References Cited

U.S. PATENT DOCUMENTS

| | | | |
|---|---|---|---|
| 7,635,600 B2* | 12/2009 | Zhang et al. | 438/7 |
| 2005/0098204 A1 | 5/2005 | Roscheisen et al. | |
| 2005/0211293 A1* | 9/2005 | Enomoto et al. | 136/263 |
| 2005/0214967 A1 | 9/2005 | Scher et al. | |
| 2006/0130890 A1 | 6/2006 | Hantschel et al. | |
| 2006/0141662 A1* | 6/2006 | Brabec et al. | 438/82 |
| 2006/0268493 A1 | 11/2006 | Miyasaka et al. | |
| 2007/0006914 A1* | 1/2007 | Lee | 136/261 |
| 2007/0111368 A1* | 5/2007 | Zhang et al. | 438/99 |
| 2007/0162263 A1 | 7/2007 | Forrest | |
| 2007/0295390 A1 | 12/2007 | Sheats et al. | |
| 2008/0035965 A1 | 2/2008 | Hayashi et al. | |
| 2008/0066802 A1 | 3/2008 | Reddy | |
| 2008/0264479 A1 | 10/2008 | Harris et al. | |
| 2009/0159120 A1 | 6/2009 | Wang et al. | |
| 2009/0159131 A1 | 6/2009 | Zheng et al. | |
| 2009/0159999 A1 | 6/2009 | Zheng et al. | |
| 2010/0006148 A1 | 1/2010 | Zheng et al. | |
| 2013/0104987 A1 | 5/2013 | Wang et al. | |

FOREIGN PATENT DOCUMENTS

| | | | |
|---|---|---|---|
| WO | WO 2004-023527 A2 | 3/2004 | |
| WO | WO 2006/025260 A1 | 3/2006 | |
| WO | WO 2006/073562 A2 | 7/2006 | |
| WO | WO 2006/101814 A2 | 9/2006 | |
| WO | WO 2006-101814 A2 | 9/2006 | |
| WO | WO 2007-098378 A1 | 8/2007 | |

OTHER PUBLICATIONS

Jin Young Kim, et al., "Efficient Tandem Polymer Solar Cells Fabricated by All-Solution Processing", Science, vol. 317, Jul. 13, 2007, p. 222-225.

Serap Gunes, et al., "Conjugated Polymer-Based Organic Solar Cells", Chem. Rev. 2007, 107, p. 1324-1338.

Alberto Mittiga, et al., "Heterojunction solar cell with 2% efficiency based on a Cu2O substrate", Applied Physics Letters 88, 163502 (2006), 2 pages.

A.P. Alivisatos, "Hybrid Nanorod-Polymer Solar Cell", National Renewable Energy Laboratory, Aug. 2003, 13 pages.

Istvan Robel, et al., "Size-Dependent Electron Injection from Excited CdSe Quantum Dots into TiO2 Nanoparticles", American Chemical Society, Jan. 5, 2007, 2 pages.

"Quantum Dots May Lead to Rainbow Solar Cell", www.physorg.com, 2008, 2 pages.

Li Yan, et al., "Effect of TiO2 Nanotubes on Polymer-Fullerene Bulk Heterojunction Solar Cells", May 22, 2007, 1 page.

Gopal K. Mor, et al., "A review on highly ordered, vertically oriented TiO2 nanotube arrays: Fabrication, material properties, and solar energy applications", Solar Energy Materials & Solar Cells 90 (2006) p. 2011-2075.

Lori E. Greene, et al., "General Route to Vertical ZnO Nanowire Arrays Using Textured ZnO Seeds", Nano Letters, 2005, vol. 5, No. 7, p. 1231-1236.

C.Y. Jiang, et al., "High-bendability flexible dye-sensitized solar cell with a nanoparticle-modified ZnO-nanowire electrode", Applied Physics Letters 92, 143101 (2008), 3 pages.

Tohru Shiga, et al., "Photovoltaic performance and stability of CdTe/polymeric hybrid solar cells using a C60 buffer layer", Solar Energy Materials & Solar Cells 90 (2006), p. 1849-1858.

B.J. Landi, et al., "CdSe quantum dot-single wall carbon nanotube complexes for polymeric solar cells", Solar Energy Materials & Solar Cells 87 (2005), p. 733-746.

European Search Report dated Feb. 10, 2009 in connection with European Patent Application No. EP 08 16 3118.

Sung Jin Kim, et al., "Tandem inorganic/organic hybrid solar cell using a PbSe nanocrystal photoconductor for carrier multiplication", Proc. of SPIE, vol. 7047, 10 pages.

Zhi Zheng, et al., "Solar Cell Having Supplementary Light-Absorbing Material and Related System and Method", U.S. Appl. No. 12/257,293, filed Oct. 23, 2008.

Office Action dated Aug. 7, 2014 in connection with U.S. Appl. No. 12/567,026; 11 pp.

Office Action dated Jul. 8, 2014 in connection with U.S. Appl. No. 12/257,293; 10 pp.

Office Action dated Feb. 14, 2014 in connection with U.S. Appl. No. 12/257,293; 10 pp.

Office Action dated Feb. 5, 2014 in connection with U.S. Appl. No. 12/567,026; 18 pp.

Office Action dated Aug. 23, 2012 in connection with U.S. Appl. No. 12/257,293; 3 pp.

Office Action dated Jun. 4, 2012 in connection with U.S. Appl. No. 12/257,293; 9 pp.

Office Action dated Mar. 1, 2012 in connection with U.S. Appl. No. 12/567,026; 3 pp.

Office Action dated Dec. 23, 2011 in connection with U.S. Appl. No. 12/567,026; 14 pp.

Office Action dated Dec. 15, 2011 in connection with U.S. Appl. No. 12/257,293; 19 pp.

Office Action dated Aug. 18, 2011 in connection with U.S. Appl. No. 12/567,026; 17 pp.

European Communication dated Apr. 8, 2011 in connection with European Patent Application No. 09173446.7; 6 pp.

European Search Report dated Apr. 1, 2011 in connection with European Patent Application No. 09173446.7; 7 pp.

European Communication dated May 12, 2009 in connection with European Patent Application No. 08165797.5; 3 pp.

* cited by examiner

SOLAR CELL HAVING HYBRID HETEROJUNCTION STRUCTURE AND RELATED SYSTEM AND METHOD

CROSS-REFERENCE TO RELATED APPLICATIONS

This application claims priority under 35 U.S.C. §119 to European Patent Application No. EP08163118 filed on Aug. 27, 2008, which is hereby incorporated by reference.

TECHNICAL FIELD

This disclosure relates generally to solar cells and more specifically to a solar cell having a hybrid heterojunction structure and related system and method.

BACKGROUND

Various types of solar cells have been developed over the years. One type of solar cell is the donor-acceptor (DA) organic solar cell, which is formed using two different plastics or other polymers. In these types of solar cells, light absorption leads to the formation of an exciton (a bound electron-hole pair) that diffuses to a donor-acceptor heterojunction interface. This interface is formed at the contact between two organic semiconductors with different valence bands (VB) and conduction bands (CB).

The exciton dissociates at this interface into a hole and an electron. If an exciton is created in the donor material and reaches the donor/acceptor interface, the electron is transferred to the acceptor material, while the hole recedes in the donor material. Similarly, if an exciton is created in the acceptor material and reaches the donor/acceptor interface, the hole is transferred to the donor material, while the electron recedes in the acceptor material. The hole travels through the donor material to a first electrode, and the electron travels through the acceptor material to a second electrode. In this way, holes and electrons can be used to supply power to an external component coupled to the electrodes.

SUMMARY

This disclosure provides a solar cell having a hybrid heterojunction structure and related system and method.

In a first embodiment, a solar cell includes multiple organic materials, including at least one donor material and at least one acceptor material. The solar cell also includes multiple inorganic materials, where the organic and inorganic materials collectively form multiple hybrid heterojunction structures. Each hybrid heterojunction structure includes at least two of the organic materials and at least one of the inorganic materials.

In particular embodiments, each of the inorganic materials includes nanowires, nanotubes, nanoparticles, and/or quantum dots. As an example, a first of the inorganic materials could include nanowires and/or nanotubes, and a second of the inorganic materials could include nanoparticles and/or quantum dots. At least some of the nanoparticles or quantum dots could have different sizes, where the different sizes are associated with different absorption bandgaps.

In other particular embodiments, the organic materials includes a first layer formed from a first of the organic materials, a second layer formed from a second of the organic materials, and a blend of the first and second organic materials between the first and second layers.

In yet other particular embodiments, the solar cell further includes multiple electrodes providing electrical connection to the solar cell. The solar cell could also include a buffer layer between the donor material and one of the electrodes. The donor material may transport holes to that electrode, and the buffer layer may improve hole injection onto that electrode.

In still other particular embodiments, excitons photo-generated in at least one of the organic materials dissociate into holes and electrons at (i) an interface between two organic materials and (ii) an interface between organic and inorganic materials. Also, electrons and holes photo-generated in at least one of the inorganic materials are separated at (i) an interface between inorganic and organic materials and (ii) an interface between two inorganic materials. The electrons are transported through one or more of the inorganic materials towards one of the electrodes. The holes are transported through one or more of the organic materials towards another of the electrodes.

In additional particular embodiments, the organic materials include (i) at least one of MEH-PPV and P3HT and (ii) at least one of CN-ether-PPV and PCBM. Also, the inorganic materials include (i) at least one of titanium oxide and zinc oxide, and (ii) at least one of cadmium selenide, cadmium sulphur, indium arsenide), indium phosphide, copper oxide, copper indium diselenide, and/or copper indium gallium diselenide.

In a second embodiment, a system includes a solar cell and circuitry configured to receive power from the solar cell. The solar cell includes multiple organic materials, including at least one donor material and at least one acceptor material. The solar cell also includes multiple inorganic materials and multiple electrodes providing electrical connection to the solar cell. Excitons photo-generated in at least one of the organic materials dissociate into holes and electrons at (i) an interface between two organic materials and (ii) an interface between organic and inorganic materials. One or more of the inorganic materials transport at least some of the electrons towards a first of the electrodes.

In a third embodiment, a method includes forming multiple first structures of one or more first inorganic materials in a solar cell. The method also includes forming multiple second structures of one or more second inorganic materials in the solar cell. The method further includes depositing multiple organic materials around at least some of the first and second structures in the solar cell. The multiple organic materials form a donor-acceptor bulk heterojunction structure in the solar cell.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 5, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1A:
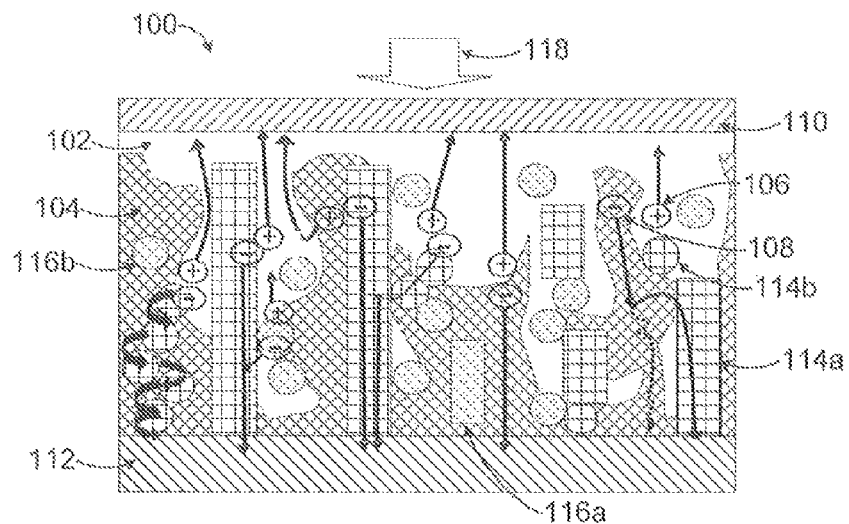
FIGS. 1A and 1B illustrate a first example solar cell having a hybrid heterojunction structure according to this disclosure.
Figure 1B:
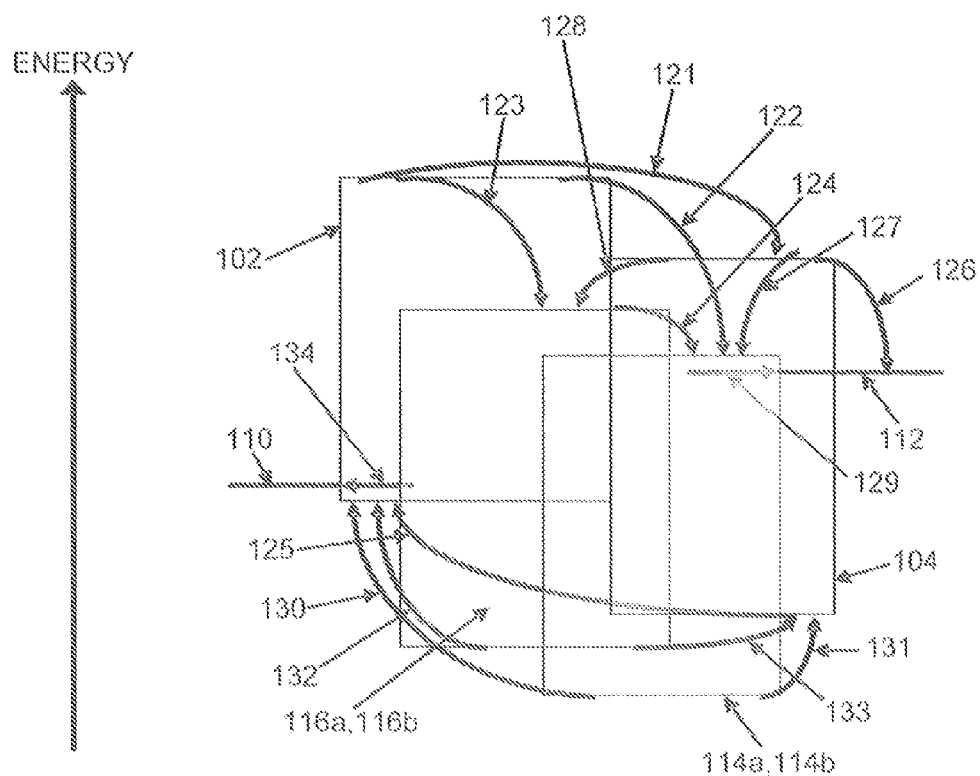

FIGS. 1A and 1B illustrate a first example solar cell 100 having a hybrid heterojunction structure according to this disclosure. The embodiment of the solar cell 100 shown in FIGS. 1A and 1B is for illustration only. Other embodiments of the solar cell 100 could be used without departing from the scope of this disclosure.

As shown in FIG. 1A, the solar cell 100 includes two organic materials 102-104. The organic materials 102-104 represent donor and acceptor materials, respectively, in the solar cell 100. For example, light absorption can create excitons in one or more of the organic materials 102-104, and the excitons diffuse to the boundary of the organic materials 102-104. At the boundary, the excitons dissociate to create holes 106 and electrons 108. At least some of the holes 106 travel through the donor organic material 102 to an electrode 110, and at least some of the electrons 108 travel through the acceptor organic material 104 to an electrode 112.

The organic material 102 represents any suitable organic material or combination of organic materials used as a donor material in a solar cell. For example, the organic material 102 could include poly(methoxy-ethylexyloxy-phenylenevinilene) (also called "MEH-PPV") or poly(3-hexylthiophene) (also called "P3HT"). The organic material 104 represents any suitable organic material or combination of organic materials used as an acceptor material in a solar cell. For example, the organic material 104 could include poly[oxa-1,4-phenylene-1,2-(1-cyano)-ethenylene-2,5 dioctyloxy-1,4-phenylene-1,2-(2-cyano)-ethenylene-1,4-phenylene] (also called "CN-ether-PPV") or 1-(3-methoxycarbonyl)-propyl-1-phenyl-(6,6)$C_{61}$ (also called "PCBM").

In this example, different organic materials 102-104 are used in the solar cell 100, so the solar cell 100 is said to have a "heterojunction" structure. Also, the organic materials 102-104 are deposited or otherwise formed having a random (non-planar) boundary, so the solar cell 100 is said to have a "bulk" structure. The random nature of the boundary between the organic materials 102-104 helps to increase the area where the organic materials 102-104 contact one another.

The two electrodes 110-112 provide an electrical connection to the solar cell 100. For example, one or more additional electrical components can be coupled to the electrodes 110-112 and powered by the solar cell 100. In this example, the electrode 110 collects the holes 106, and the electrode 112 collects the electrons 108. Each of the electrodes 110-112 includes any suitable material or combination of materials providing an electrical connection. Various example materials include titanium, silver, gold, copper, tin oxide ($SnO_2$), or indium tin oxide (ITO).

Some conventional solar cells have low efficiency due to (among other things) poor coverage of the solar spectrum, small exciton diffusion lengths, and poor charge transport properties. To help reduce or eliminate these or other problems, the solar cell 100 in this example includes at least two inorganic materials 114a-114b and 116a-116b.

The inorganic materials in the solar cell 100 could have any suitable form. For example, the inorganic materials could include nanowires or nanotubes (inorganic materials 114a and 116a). The inorganic materials could also include quantum dots or nanoparticles (inorganic materials 114b and 116b). Note that these represent example forms for the inorganic materials. Each inorganic material could have one or more of these forms or any other or additional form(s).

The inorganic materials 114a-114b and 116a-116b help to dissociate excitons into holes 106 and electrons 108. The inorganic materials 114a-114b and 116a-116b also help to transport electrons 108 to the electrode 112. The inorganic materials 114a-114b and 116a-116b further act as light absorbers, helping to improve solar spectrum coverage of the solar cell 100.

Various functions of the solar cell 100 are illustrated in FIG. 1B, which illustrates an energy bands schema for the solar cell 100. More specifically, FIG. 1B illustrates an energy bandgap for each of the organic materials 102-104 and inorganic materials 114a-114b, 116a-116b. Each energy bandgap has a conduction band edge along its upper edge in FIG. 1B and a valence band edge along its lower edge in FIG. 1B. The area between the conduction and valence band edges denotes the energy bandgap.

Excitons created in the organic material 102 can be dissociated at:

(i) the interface between the organic material 102 and the organic material 104, with electrons transferred to the organic material 104 (denoted as process 121) and holes receding in the organic material 102;

(ii) the interface between the organic material 102 and the inorganic material 114a-114b, with electrons transferred to the inorganic material 114a-114b (denoted as process 122) and holes receding in the organic material 102; and (iii) the interface between the organic material 102 and the inorganic material 116a-116b, with electrons transferred to the inorganic material 116a-116b (denoted as process 123) and then to the inorganic material 114a-114b (denoted as process 124) and holes receding in the organic material 102.

Excitons created in the organic material 104 can be dissociated at:

(i) the interface between the organic material 104 and the organic material 102, with holes transferred to the organic material 102 (denoted as process 125) and electrons receding in the organic material 104 and then transferred to the electrode 112 directly (denoted as process 126) or indirectly through the inorganic material 114a-114b (denoted as process 127);

(ii) the interface between the organic material 104 and the inorganic material 114a-114b, with electrons transferred to the inorganic material 114a-114b (by process 127) and holes receding in the organic material 104 and transferred to the organic material 102 (by process 125); and (iii) the interface between the organic material 104 and the inorganic material 116a-116b, with electrons transferred to the inorganic material 116a-116b (denoted as process 128) and then to either the inorganic material 114a-114b (by process 124) or to the electrode 112 and holes receding in the organic material 104 and transferred to the organic material 102 (by process 125).

Electrons and holes photo-generated in the inorganic material 114a-114b are separated at the interfaces with the organic materials 102-104. The electrons are transferred to the electrode 112 (denoted as process 129). The holes are transferred directly to the organic material 102 (denoted as process 130) or to the organic material 104 (denoted as process 131) and then to the organic material 102 (by process 125).

Electrons and holes photo-generated in the inorganic material 116a-116b are separated at the interfaces with the organic materials 102-104 and with the inorganic material 114a-114b. The electrons are transferred to the inorganic material 114a-114b (by process 124). The holes are transferred directly to the organic material 102 (denoted as process 132) or to the organic material 104 (denoted as process 133) and then to the organic material 102 (by process 125).

The electrons receding and/or collected by the inorganic material 114a-114b may flow through the inorganic material 114a-114b towards the electrode 112 (by process 129). Also, the holes receding and/or collected by the organic material 102 may flow through the organic material 102 towards the electrode 110 (denoted as process 134).

In this way, the solar cell 100 represents a "hybrid" solar cell in that it includes the heterojunction structure (formed by the organic materials 102-104) and two or more inorganic materials 114a-114b, 116a-116b. In fact, the solar cell 100 could be said to include two hybrid heterojunctions—one formed by the organic materials 102-104 and the inorganic material 114a-114b, and another formed by the organic materials 102-104 and the inorganic material 116a-116b. The use of the inorganic materials 114a-114b, 116a-116b facilitates more efficient and effective charge separation and conduction. Moreover, different inorganic materials can be used as absorbers to extend the coverage of the solar spectrum, increasing the solar cell's ability to harvest light in a wider range of frequencies. Further, the solar cell 100 could represent a flexible structure that can be shaped as needed. In addition, the solar cell 100 could be manufactured in a low-cost manner and on a large scale.

Each of the inorganic materials 114a-114b, 116a-116b includes any suitable inorganic material or combination of materials facilitating absorption, charge separation and conduction in a solar cell. In some embodiments, the inorganic materials 114a-114b and 116a-116b could represent inorganic materials having different levels of valence and different conduction bands, such as inorganic materials forming a Type II heterostructure. As particular examples, the inorganic material 114a-114b could include titanium oxide ($TiO_2$) or zinc oxide (ZnO). As other particular examples, the inorganic material 116a-116b could include nanoparticles or quantum dots of cadmium selenide (CdSe), cadmium sulphur (CdS), indium arsenide (InAs), indium phosphide (InP), copper oxides such as cupric oxide (CuO) or cuprous oxide ($Cu_2O$), copper indium diselenide ($CuInSe_2$) or "CIS," or copper indium gallium diselenide ($CuInGaSe_2$) or "CIGS." The inorganic material 116b could also have suitable dimensions so as to support or favor electron injection into the inorganic materials 114a-114b, 116a.

In this example, light 118 strikes the solar cell 100 on the top of the solar cell 100 in FIG. 1A. In this embodiment, the electrode 110 could be formed from tin oxide, indium tin oxide, or other transparent material(s). It may be noted that the light 118 could strike the solar cell 100 in any other or additional location(s). For example, the light 118 could strike the solar cell 100 on the bottom of the solar cell 100 in FIG. 1A. In that embodiment, the electrode 112 could be formed from tin oxide, indium tin oxide, or other transparent material(s).

Although FIGS. 1A and 1B illustrate a first example solar cell 100 having a hybrid heterojunction structure, various changes may be made to FIGS. 1A and 1B. For example, the solar cell 100 could include only one form or more than two forms of the inorganic material 114a-114b, and the solar cell 100 could include only one form or more than two forms of the inorganic material 116a-116b. Also, the organic materials 102-104 could have any suitable boundary, and the inorganic materials 114a-114b and 116a-116b could have any suitable distribution in the solar cell 100. Further, any number of organic and inorganic materials could be used in the solar cell 100. In addition, FIG. 1B illustrates various examples of the processes that could be used to transfer holes and electrons in the solar cell 100. The solar cell 100 could support other or additional processes for transferring holes and electrons (which may vary based on the arrangement of the inorganic materials 114a-114b, 116a-116b in the solar cell 100).

Figure 2:
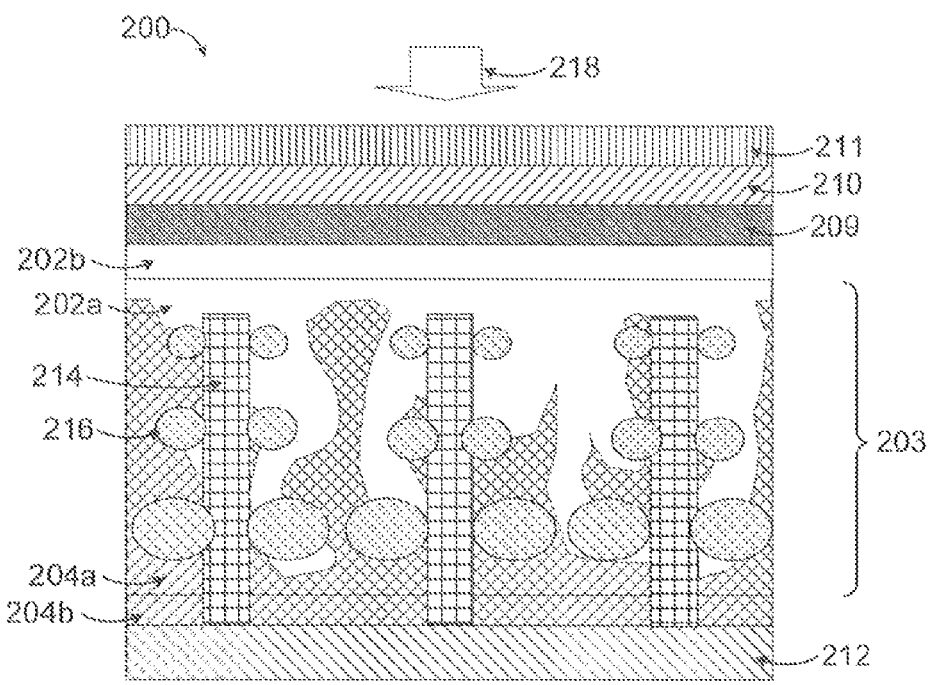
FIG. 2 illustrates a second example solar cell having a hybrid heterojunction structure according to this disclosure.

FIG. 2 illustrates a second example solar cell 200 having a hybrid heterojunction structure according to this disclosure. The embodiment of the solar cell 200 shown in FIG. 2 is for illustration only. Other embodiments of the solar cell 200 could be used without departing from the scope of this disclosure.

As shown in FIG. 2, the solar cell 200 operates in the same or similar manner as the solar cell 100 shown in FIGS. 1A and 1B. For example, the solar cell 200 includes two organic materials 202a and 204a. In this example, the organic materials 202a and 204a meet along a boundary formed in an area 203 of the solar cell 200. This area 203 is located between two layers of unblended or pure organic material, namely organic layers 202b and 204b. As particular examples, the organic material 202a and the organic layer 202b could represent MEH-PPV or P3HT, and the organic material 204a and the organic layer 204b could represent CN-ether-PPV or PCBM.

In this embodiment, a buffer layer 209 is formed between the organic layer 202a and an electrode 210. Among other things, the buffer layer 209 could help to improve hole injection onto the electrode 210. The buffer layer 209 could be formed from any suitable material or combination of materials, such as poly(3,4-ethylenedioxythiophene)poly(styrenesulfonate) (also called "PEDOT:PSS"). The electrode 210 could be formed from any suitable material or combination of materials, such as tin oxide or other transparent material(s). A cover 211 is formed over the electrode 210, which can provide protection for the solar cell 200. The cover 211 could be formed from any suitable material or combination of materials, such as glass, plastic, or other transparent material(s). Another electrode 212 is formed under the organic layer 204b. The electrode 212 could be formed from any suitable material or combination of materials, such as titanium.

The solar cell 200 includes at least two inorganic materials 214-216. The inorganic material 214 in this example could represent nanowires or nanotubes, while the inorganic material 216 could represent quantum dots or nanoparticles. As a particular example, the inorganic material 214 could represent titanium oxide or zinc oxide nanowires or nanotubes, and the inorganic material 216 could represent nanoparticles or quantum dots of cadmium selenide, cadmium sulphur, indium arsenide, indium phosphide, copper oxides, copper indium diselenide, copper indium gallium diselenide with suitable dimensions for electron injection into the inorganic material 214. Note, however, that any other or additional forms and any other or additional sizes could be used.

As shown in FIG. 2, the quantum dots or nanoparticles formed by the inorganic material 216 have different sizes. Among other things, the different sizes of the quantum dots or nanoparticles can help to facilitate the capture of a larger portion of the solar spectrum since the different sizes are associated with different bandgaps. Note, however, that quantum dots or nanoparticles with the same or similar size could also be used in the solar cell 200.

In this example, light 218 strikes the solar cell 200 on the top of the solar cell 200 in FIG. 2. In this embodiment, the cover 211, electrode 210, and buffer layer 209 could each be formed from one or more transparent materials.

In particular embodiments, the solar cell 200 could be fabricated as follows. A titanium foil (a substrate) could undergo an anodization process to form titanium oxide nanotubes on the foil. The foil represents the electrode 212 in FIG. 2, and the nanotubes represent the inorganic material 214 in FIG. 2. Cadmium selenide nanoparticles or quantum dots (representing the inorganic material 216 in FIG. 2) could be attached to the nanotubes. The largest CdSe nanoparticles or quantum dots could be around 3.5 nm in diameter. A polymer blend (such as MEH-PPV and CN-ether-PPV or P3HT and PCBM) is cast on the structure to form the organic materials 202a and 204a in the area 203. The polymer blend is "sandwiched" between the organic layers 202b and 204b, which could be formed of pure donor and acceptor materials. The buffer layer 209 (such as a PEDOT layer) is formed over the cell structure. A transparent cover 211 (such as glass or plastic) provided with a transparent conductive layer forming the electrode 210 (such as an $SnO_2$ layer) is attached onto the top of the buffer layer 209. Alternatively, the conductive layer forming the electrode 210 could be deposited on top of the buffer layer 209, and the cover 211 could be formed on or attached to the electrode 210. Note that each layer of material(s) described here could be formed in any suitable manner. Also note that this fabrication technique is provided for illustration only, and the solar cell 200 could be formed in any other suitable manner.

Although FIG. 2 illustrates a second example solar cell 200 having a hybrid heterojunction structure, various changes may be made to FIG. 2. For example, the solar cell 200 could include more than one form of the inorganic material 214 and more than one form of the inorganic material 216. Also, the organic materials 202a-204a could have any suitable boundary, and the inorganic materials 214 and 216 could have any suitable distribution in the solar cell 200. Further, any number of organic and inorganic materials could be used in the solar cell 200. In addition, any suitable number of nanoparticle or quantum dot sizes could be used with the inorganic material 216.

Figure 3:
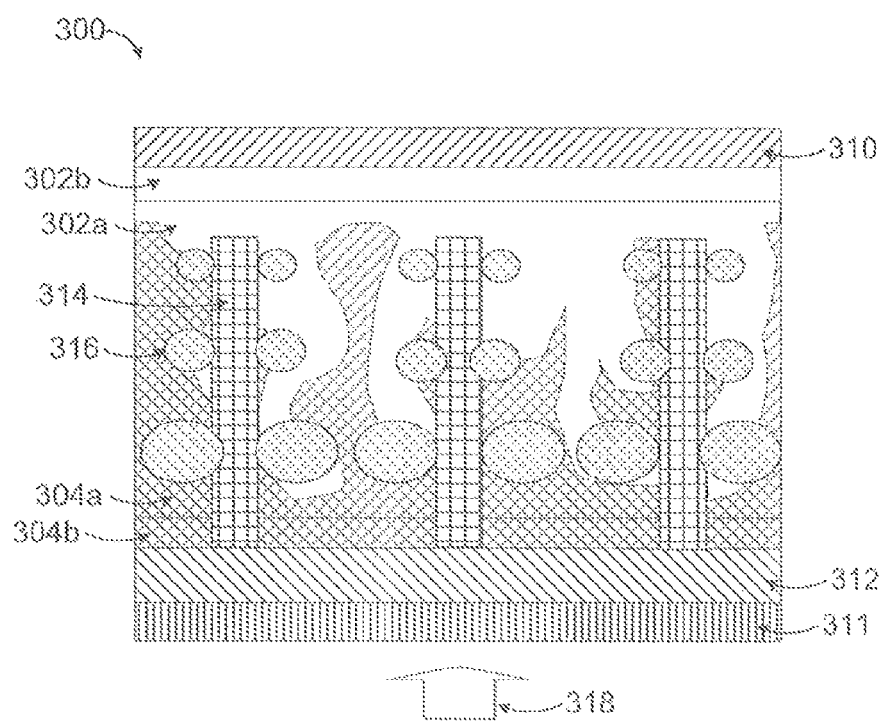
FIG. 3 illustrates a third example solar cell having a hybrid heterojunction structure according to this disclosure.

FIG. 3 illustrates a third example solar cell 300 having a hybrid heterojunction structure according to this disclosure. The embodiment of the solar cell 300 shown in FIG. 3 is for illustration only. Other embodiments of the solar cell 300 could be used without departing from the scope of this disclosure.

As shown in FIG. 3, the solar cell 300 operates in the same or similar manner as the solar cell 200 shown in FIG. 2. For example, the solar cell 300 includes two organic materials 302a and 304a meeting along a boundary, as well as two additional organic layers 302b and 304b. The solar cell 300 also includes an electrode 310 formed on the organic layer 302b and an electrode 312 formed on the organic layer 304b. In particular embodiments, the electrode 310 could be formed from gold, and the electrode 312 could be formed from tin oxide. The solar cell 300 further includes inorganic materials 314 (such as nanotubes or nanowires) and 316 (such as quantum dots or nanoparticles). A cover 311 (such as glass or plastic) protects the electrode 312.

In this example, light 318 strikes the solar cell 300 on the bottom of the solar cell 300 in FIG. 3. In this embodiment, the cover 311 and electrode 312 could each be formed from one or more transparent materials.

In particular embodiments, the solar cell 300 could be fabricated as follows. A titanium foil could undergo an anodization process to form titanium oxide nanotubes on the foil. The foil represents the electrode 312 in FIG. 3, and the nanotubes represent the inorganic material 314 in FIG. 3. Cadmium selenide nanoparticles or quantum dots (representing the inorganic material 316 in FIG. 3) could be attached to the nanotubes. The largest CdSe nanoparticles or quantum dots could be around 3.5 nm in diameter. A polymer blend (such as MEH-PPV and CN-ether-PPV or P3HT and PCBM) is cast on the structure to form the organic materials 302a and 304a. The polymer blend is "sandwiched" between the organic layers 302b and 304b, which could be formed of pure donor and acceptor materials. Gold or other conductive material is deposited to form the electrode 310, or the conductive material could be deposited on a substrate and the conductive material/substrate combination could be attached to the cell structure. Similarly, a transparent cover 311 (such as glass or plastic) provided with a transparent conductive layer forming the electrode 312 (such as an $SnO_2$ layer) could be attached onto the bottom of the cell structure, or the conductive layer forming the electrode 312 could be deposited on the cell structure and covered by the cover 311. Note that each layer of material(s) described here could be formed in any suitable manner. Also note that this fabrication technique is provided for illustration only, and the solar cell 300 could be formed in any other suitable manner.

In other particular embodiments, the inorganic material 314 represents ZnO nanowires. The ZnO nanowires could be grown on a transparent substrate, and the substrate can be covered with a transparent conductive oxide such as $SnO_2$ (where the transparent conductive oxide forms the electrode 312). The same or similar process could then occur to complete the formation of the solar cell 300.

Although FIG. 3 illustrates a third example solar cell 300 having a hybrid heterojunction structure, various changes may be made to FIG. 3. For example, the solar cell 300 could include more than one form of the inorganic material 314 and more than one form of the inorganic material 316. Also, the organic materials 302a-304a could have any suitable boundary, and the inorganic materials 314 and 316 could have any suitable distribution in the solar cell 300. Further, any number of organic and inorganic materials could be used in the solar cell 300. In addition, any suitable number of nanoparticle or quantum dot sizes could be used with the inorganic material 316.

Figure 4:
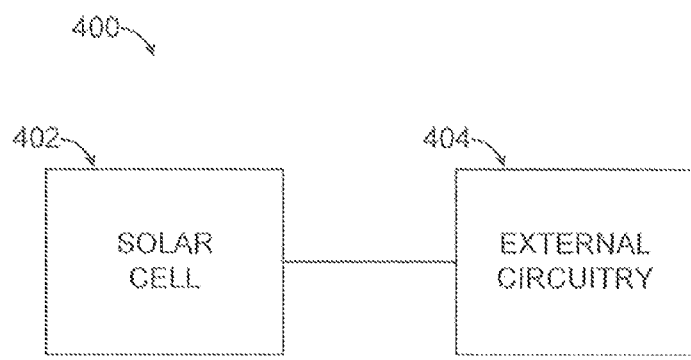
FIG. 4 illustrates an example circuit containing a solar cell having a hybrid heterojunction structure according to this disclosure.

FIG. 4 illustrates an example circuit 400 containing a solar cell having a hybrid heterojunction structure according to this disclosure. The circuit 400 shown in FIG. 4 is for illustration only. Other circuits could use the solar cells described above without departing from the scope of this disclosure.

In this example, a solar cell 402 is coupled to external circuitry 404. The solar cell 402 could represent any suitable solar cell having a hybrid heterojunction structure, where organic and inorganic materials are used to facilitate charge separation and conduction. The solar cell 402 could, for example, represent one or more of the solar cells 100-300 described above.

The external circuitry 404 represents any suitable circuitry for using power provided by the solar cell 402. For example, the external circuitry 404 could represent circuitry that performs monitoring or reporting functions in a wireless asset tag. The external circuitry 404 could also represent circuitry that performs monitoring or control functions in an industrial processing environment. The external circuitry 404 could further represent circuitry that uses the power from the solar cell 402 to recharge a battery or other power source. The external circuitry 404 could perform any other or additional functionality according to particular needs. At least part of the power used by the external circuitry 404 may be provided by the solar cell 402.

Although FIG. 4 illustrates an example circuit 400 containing a solar cell having a hybrid heterojunction structure, various changes may be made to FIG. 4. For example, the circuit 400 could include any number of solar cells 402 and external circuitry 404. Also, the solar cells 100-300 described above could be used in any other suitable manner.

Figure 5:
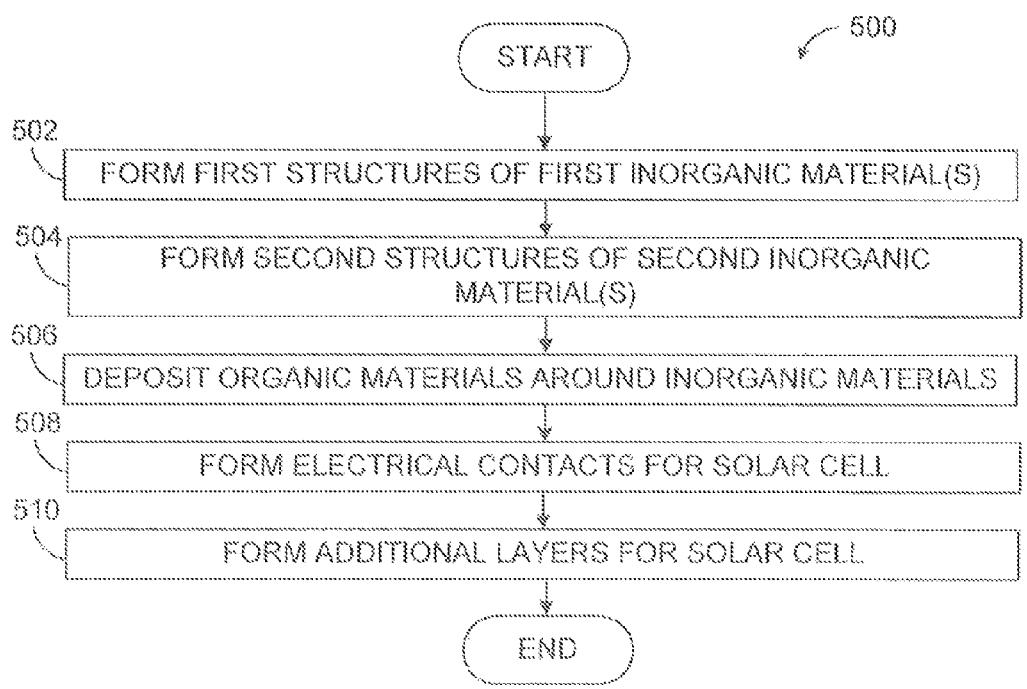
FIG. 5 illustrates an example method for forming a solar cell having a hybrid heterojunction structure according to this disclosure.

FIG. 5 illustrates an example method 500 for forming a solar cell having a hybrid heterojunction structure according to this disclosure. The method 500 shown in FIG. 5 is for illustration only. Solar cells could be manufactured in any other suitable manner without departing from the scope of this disclosure.

One or more first structures are formed from a first inorganic material or combination of inorganic materials at step 502. This could include, for example, forming nanotubes or nanowires from titanium oxide or zinc oxide. As a particular example, this could include performing an anodization process on a titanium film to form titanium oxide nanotubes or growing zinc oxide nanowires on a substrate.

One or more second structures are formed from a second inorganic material or combination of inorganic materials at step 504. This could include, for example, depositing cadmium selenide nanoparticles or quantum dots on the previously-formed nanotubes or nanowires. As a particular example, this could include depositing cadmium selenide nanoparticles or quantum dots of different sizes onto the nanotubes or nanowires.

Organic materials are deposited around the inorganic materials at step 506. This could include, for example, depositing MEH-PPV and CN-ether-PPV or P3HT and PCBM around the nanotubes, nanowires, nanoparticles, or quantum dots. This may also include initially forming two pure layers of different organic materials and then sandwiching a blend of different organic materials between the two layers.

Electrical contacts for the solar cell are formed at step 508. This could include, for example, depositing one or more layers of metal or other conductive material(s) to form each electrical contact. This could also include attaching a cover, substrate, or other structure carrying an electrical contact to the other structures of the solar cell. Note that at least one of the electrical contacts could have been formed during prior steps, such as when the nanotubes or nanowires are formed using a conductive foil (where the foil forms the electrical contact).

Any additional layers are formed at step 510. This could include, for example, forming transparent covers or other protective layers in the solar cell. Note that one or more additional layers could also be formed earlier in the method 500, such as when a buffer layer is formed prior to the formation of an electrical contact.

Although FIG. 5 illustrates an example method 500 for forming a solar cell having a hybrid heterojunction structure, various changes may be made to FIG. 5. For example, while shown as a series of steps, various steps in FIG. 5 could overlap, occur in parallel, occur in a different order, or occur multiple times.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. Terms such as "over" and "under" refer to relative positions in the figures and do not denote required orientations during manufacturing or use. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A solar cell comprising:
   multiple organic materials including at least one donor material and at least one acceptor material; and
   multiple inorganic materials, wherein the organic and inorganic materials collectively form multiple hybrid heterojunction structures, each hybrid heterojunction structure comprising at least two of the organic materials and at least one of the inorganic materials;
   wherein a first of the inorganic materials comprises at least one of: first nanowires and first nanotubes;
   wherein a second of the inorganic materials comprises at least one of: first nanoparticles and first quantum dots, the second inorganic material having an interface with the first inorganic material; and
   wherein each of the first and second inorganic materials has interfaces with both the at least one donor material and the at least one acceptor material.

2. The solar cell of claim 1, wherein each of the inorganic materials comprises at least one of: nanowires, nanotubes, nanoparticles, and quantum dots.

3. The solar cell of claim 1, wherein:
   the first inorganic material further comprises at least one of: second nanoparticles and second quantum dots; and
   the second inorganic material further comprises at least one of: second nanowires and second nanotubes.

4. The solar cell of claim 1, wherein at least some of the first nanoparticles or first quantum dots have different sizes, the different sizes associated with different absorption bandgaps.

5. The solar cell of claim 1, wherein the organic materials comprise:
   a first layer comprising a first of the organic materials;
   a second layer comprising a second of the organic materials; and
   a blend of the first and second organic materials between the first and second layers.

6. The solar cell of claim 1, further comprising:
   multiple electrodes configured to provide electrical connection to the solar cell.

7. The solar cell of claim 6, further comprising:
   a buffer layer between the at least one donor material and one of the electrodes, wherein the at least one donor material transports holes to that electrode, and wherein the buffer layer is configured to improve hole injection onto that electrode.

8. The solar cell of claim 6, wherein:
   excitons photo-generated in at least one of the organic materials dissociate into holes and electrons at (i) an interface between two organic materials and (ii) the interfaces between organic and inorganic materials;
   electrons and holes photo-generated in at least one of the inorganic materials are separated at (i) the interfaces between inorganic and organic materials and (ii) the interface between two inorganic materials;

the electrons are transported through one or more of the inorganic materials towards one of the electrodes; and the holes are transported through one or more of the organic materials towards another of the electrodes.

9. The solar cell of claim 1, wherein:

the organic materials comprise (i) at least one of MEH-PPV and P3HT and (ii) at least one of CN-ether-PPV and PCBM; and the inorganic materials comprise (i) at least one of: titanium oxide and zinc oxide and (ii) at least one of: cadmium selenide, cadmium sulphur, indium arsenide), indium phosphide, copper oxide, copper indium diselenide, and/or copper indium gallium diselenide.

10. The solar cell of claim 1, wherein the solar cell is flexible.

11. A system comprising a solar cell and circuitry configured to receive power from the solar cell, the solar cell comprising:

multiple organic materials including at least one donor material and at least one acceptor material;

multiple inorganic materials; and multiple electrodes configured to provide electrical connection to the solar cell;

wherein a first of the inorganic materials comprises at least one of: first nanowires and first nanotubes;

wherein a second of the inorganic materials comprises at least one of: first nanoparticles and first quantum dots, the second inorganic material having an interface with the first inorganic material;

wherein each of the first and second inorganic materials has interfaces with both the at least one donor material and the at least one acceptor material;

wherein excitons photo-generated in at least one of the organic materials dissociate into holes and electrons at (i) an interface between two organic materials and (ii) the interfaces between organic and inorganic materials; and wherein one or more of the inorganic materials transport at least some of the electrons towards a first of the electrodes.

12. The system of claim 11, wherein electrons and holes photo-generated in at least one of the inorganic materials are separated at (i) the interfaces between inorganic and organic materials and (ii) the interface between two inorganic materials.

13. The system of claim 11, wherein the organic and inorganic materials in the solar cell collectively form multiple hybrid heterojunction structures, each hybrid heterojunction structure comprising at least two of the organic materials and at least one of the inorganic materials.

14. The solar cell of claim 11, wherein:

the first inorganic material further comprises at least one of: second nanoparticles and second quantum dots; and the second inorganic material further comprises at least one of: second nanowires and second nanotubes.

15. The solar cell of claim 11, wherein at least some of the first nanoparticles or first quantum dots have different sizes, the different sizes associated with different absorption bandgaps.

16. The system of claim 11, wherein the solar cell further comprises:

a buffer layer between the at least one donor material and a second of the electrodes, wherein the at least one donor material transports holes to the second electrode, and wherein the buffer layer is configured to improve hole injection onto the second electrode.

17. A method comprising:

forming multiple first structures of one or more first inorganic materials in a solar cell;

forming multiple second structures of one or more second inorganic materials in the solar cell, the second inorganic material having an interface with the first inorganic material; and depositing multiple organic materials including at least one donor material and at least one acceptor material around at least some of the first and second structures in the solar cell;

wherein the multiple organic materials form a donor-acceptor bulk heterojunction structure in the solar cell;

wherein forming the multiple first structures comprises forming at least one of: nanowires and nanotubes;

wherein forming the multiple second structures comprises forming at least one of: nanoparticles and quantum dots; and wherein each of the first and second inorganic materials has interfaces with both the at least one donor material and the at least one acceptor material.

18. The method of claim 17, further comprising:

generating excitons in at least one of the organic materials;

dissociating the excitons into holes and electrons at (i) an interface between two organic materials and (ii) the interfaces between organic and inorganic materials; and transporting at least some of the electrons towards one of multiple electrodes using one or more of the inorganic materials.

19. The method of claim 17, further comprising:

generating holes and electrons in at least one of the inorganic materials;

separating the holes and electrons at (i) the interfaces between inorganic and organic materials and (ii) the interface between two inorganic material;

transporting at least some of the electrons towards one of multiple electrodes using one or more of the inorganic materials; and transporting at least some of the holes towards another of the multiple electrodes using one or more of the organic materials.

20. The method of claim 17, wherein:

forming the first structures comprises forming at least one of the nanotubes and the nanowires on a substrate; and forming the second structures comprises attaching at least one of the nanoparticles and the quantum dots to the nanotubes or nanowires.

* * * * *